United States Patent [19]

Takahashi et al.

[11] Patent Number: 4,920,037
[45] Date of Patent: Apr. 24, 1990

[54] PHOTOPOLYMERIZABLE COMPOSITION

[75] Inventors: Noriaki Takahashi, Yokohama; Noriko Watanabe, Machida, both of Japan

[73] Assignee: Mitsubishi Kasei Corporation, Tokyo, Japan

[21] Appl. No.: 406,180

[22] Filed: Sep. 13, 1989

Related U.S. Application Data

[63] Continuation of Ser. No. 62,077, Jun. 10, 1987, abandoned.

[30] Foreign Application Priority Data

Jun. 10, 1986 [JP]  Japan ................................. 61-134532

[51] Int. Cl.$^5$ ................................................ G03C 1/76
[52] U.S. Cl. ..................................... 430/287; 430/281; 430/284; 430/288; 522/95; 522/117; 522/149
[58] Field of Search ............... 430/281, 287, 288, 284; 522/95, 117, 149

[56] References Cited

U.S. PATENT DOCUMENTS

| | | | |
|---|---|---|---|
| 2,811,443 | 10/1957 | Robertson et al. | 430/287 |
| 3,753,720 | 8/1973 | Kloczewski et al. | 430/288 |
| 4,047,963 | 9/1977 | Simpson | 430/288 |
| 4,435,497 | 3/1984 | Irving | 430/288 |
| 4,511,645 | 4/1985 | Koike et al. | 430/288 |
| 4,528,332 | 7/1985 | Ai et al. | 430/287 |
| 4,587,162 | 5/1986 | Nagai et al. | 430/287 |

Primary Examiner—Jack P. Brammer
Attorney, Agent, or Firm—Oblon, Spivak, McClelland, Maier & Neustadt

[57] ABSTRACT

Disclosed herein is a photopolymerizable composition containing at least (A) a high-molecular compound with a weight-average molecular weight of not less than 10,000 having a polymerizable double bond in the side chain, and (B) a polymerizable monomer represented by the following formula (I):

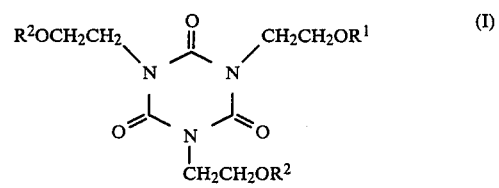

(wherein $R^1$, $R^2$ and $R^3$ represent hydrogen atom,

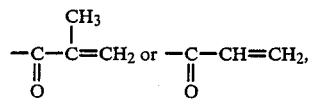

and two or more of them are not hydrogen atom at the same time).

7 Claims, No Drawings

PHOTOPOLYMERIZABLE COMPOSITION

This application is a continuation of application Ser. No. 062,077, filed on June 10, 1987, now abandoned.

BACKGROUND OF THE INVENTION

The present invention relates to a novel photopolymerizable composition having excellent properties for use as a solder resist in production of printed circuit boards or as an electroless plating resist and therefore suited for use in preparation of a permanent protective mask. More particularly, the present invention relates to a photopolymerizable composition suited for use as a contact exposure type solder photoresist for printed circuit boards on which the resist is applied and, after removing the solvent, image exposure and development are conducted to form a desired pattern.

Screen printing method has been popularly used for forming a solder resist used in the production of printed circuit boards. This method, however, had the problem in resolving performance and improvement thereof has been desired.

As a resist forming technique by which excellent resolving performance is provided, there is known a method in which a liquid photosensitive composition is applied on the whole surface of a circuit-formed base plate and, after removing the solvent by heating, image exposure is made through a mask, followed by the development to form a resist patern. However, this method also had the disadvantages such as possible adhesion of the mask to the surface coat of the base plate during the exposure due to high tackiness of the coat after removal of the solvent, poor developing performance, sensitivity and solvent resistance, and unsatisfactory adherence to the solder circuit.

Screen ink compositions for solder resist containing a compound such as trisacryloyloxyethyl isocyanurate represented by the following formula (I) and an oligomer or monomer having a molecular weight of not more than 5,000 have been known (Japanese Patent Application Laid-Open (KOKAI) Nos. 25371/83 and 51962/84):

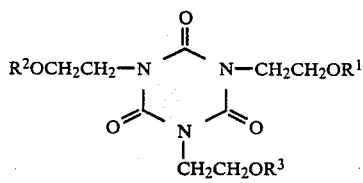

(wherein $R^1$, $R^2$ and $R^3$ represent hydrogen atom,

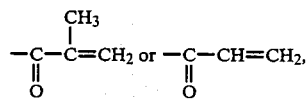

and two or more of them are not hydrogen atom at the same time).

The coating film formed from these compositions has tackiness, but since these compositions are intended to be used as screen ink for forming images by printing and no step of image exposure through a mask is involved, the surface tackiness poses no problem. However, in the case of the resist forming method of the present invention wherein image exposure is made through a mask, the surface tackiness becomes a serious problem. Also, in the case of screen ink, sensitivity at the time of image exposure and developing performance offer no problem since no step of image exposure and development is involved, but they become a problem in the case of the resist forming method of the present invention.

As a result of the studies for solving the problems, it has been found that a composition containing at least (A) a high-molecular compound with a weight-average molecular weight of not less than 10,000 having a polymerizable double bond in the side chain and (B) a polymerizable monomer represented by the following formula (I), in the case of having formed a coating film after removing the solvent, the thus obtained coating film showing small in tackiness, good developability, high sensitivity, solvent resistance and excellent adhesiveness to solder, and the present invention has been attained on the basis of this finding.

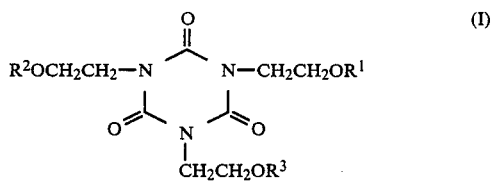

(wherein $R^1$ to $R^3$ represent hydrogen atom,

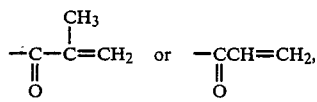

and two or more of them are not hydrogen atom at the same time).

The object of the present invention is to provide a coating solvent-removing type photosensitive resist composition containing a specific high-molecular compound, in which in the case of having formed a coating film after removing the solvent, the thus obtained coating film shows small in tackiness, high in sensitivity at the time of image exposure through a mask and excellent in developability.

SUMMARY OF THE INVENTION

In an aspect of the present invention, there is provided a photopolymerizable composition containing at least (A) a high-molecular compound with a weight-average molecular weight of not less than 10,000 having a polymerizable double bond in the side chain, and (B) a polymerizable monomer represented by the following formula (I):

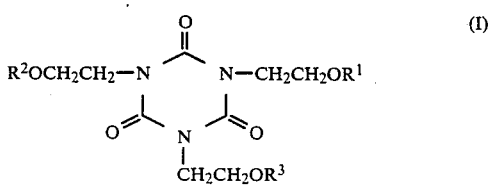

(wherein $R^1$, $R^2$ and $R^3$ represent hydrogen atom,

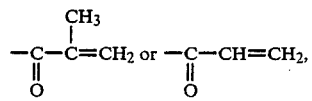

and two or more of them are not hydrogen atom at the same time).

DETAILED DESCRIPTION OF THE INVENTION

The first component (A) of the composition of the present invention is a high-molecular compound with a weight-average molecular weight of not less than 10,000 having a polymerizable double bond in the side chain.

This compound, when combined with a polymerizable monomer represented by the formula (I) of the second component, produces a specific synergistic effect to provide a coating film which shows low tackiness, high sensitivity, good developability and excellent solvent resistance.

Typical examples of such high-molecular compound are polymers made by esterification-introducing (meth)acrylic acid into (meth)acrylic polymers containing hydroxyethyl (meth)acrylate or hydroxypropyl (meth)acrylate singly or as a copolymer; polymers made by esterification-introducing (meth)acrylic acid into the hydroxyl group of phenoxy resin; polymers made by esterification-introducing (meth)allyl group into the hydroxyl group of phenoxy resin; polymers made by addition-modifying glycidyl (meth)acrylate with the hydroxyl group of phenoxy resin; (co)polymers of diallyl (iso)phthalate and/or triallyl isocyanurate; polymers made by esterification-introducing (meth)acrylic acid, crotonic acid, cinnamic acid or the like to (co)polymers of glycidyl (meth)acrylate; polymers made by addition-introducing glycidyl (meth)acrylate to carboxyl group-containing polymers; polymers made by reacting compound containing both of hydroxyl group and (meth)acryl group with copolymers of maleic acid; and polymers made by esterification-introducing (meth)acrylic acid to vinyl acetate polymers.

Among these polymers, those having a (meth)acryloyl group are advantageous. (Meth)acrylic polymers containing the polymerization units represented by the following formula (III) are most preferred.

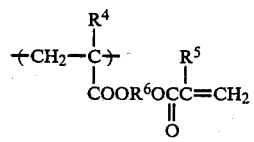

(wherein $R^4$ and $R^5$ may be the same or different and represent hydrogen atom or a methyl group, and $R^6$ represents

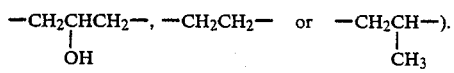

A weight-average molecular weight of these high-molecular compounds needs not less than 10,000 for producing the desired synergistic effect in combination with a polymerizable monomer (B) of the formula (I) which is the second component of the composition of the present invention. It is especially preferable in terms of coatability, coating film surface tackiness and chemical resistance that the weight-average molecular weight of the high-molecular compound is in the range of 30,000 to 300,000.

The second component (B) of the composition of the present invention is a polymerizable monomer represented by the formula (I):

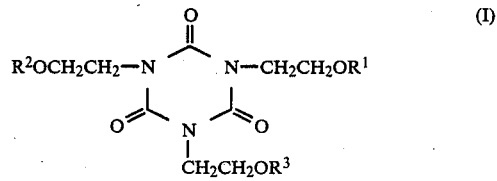

(wherein $R^1$ to $R^3$ represent hydrogen atom,

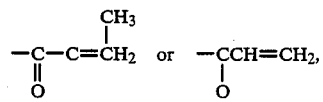

and two or more of them are not hydrogen atom at the same time).

Typical examples of such polymerizable monomer are tris(meth)acrylolyoxyethyl isocyanurate, tris(meth)acryloyloxypropyl isocyanurate, and di(meth)acryloyloxyethylhydroxyethyl isocyanurate.

In the case of using these polymerizable monomers having a weight-average molecular weight of not less than 10,000 and a polymerizable double bond in the side chain in combination with a high-molecular compound (A) and forming a coating film after removing the solvent, these polymerizable monomers can provide a coating film which is small in tackiness, not adherent to the mask film and high in sensitivity.

It is preferable to add a third component (C) to the composition of the present invention. The third component is at least one substance selected from N-vinyl-2-pyrrolidone, monomers having the structural units represented by the following formula (II) and urethane (meth)acrylate compounds.

$$\begin{matrix} R^7 \\ | \\ +CHCH_2O +_n \end{matrix} \quad (II)$$

(wherein n represents an integer from 5 to 25, and $R^7$ represents hydrogen atom or a methyl group).

The addition of this third component improves adhesiveness to the glass epoxy substrate, paper phenol substrate, copper surface and solder surface.

As the monomers having the structural units represented by the formula (II),

-continued

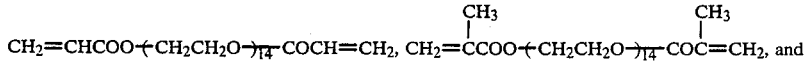

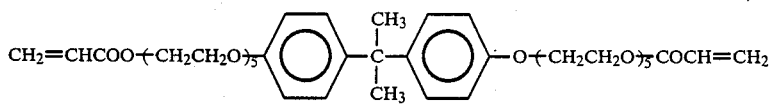

may be exemplified.

As the urethane (meth)acrylate compounds usable as the third component in the present invention, reaction products obtained by reacting diisocyanate compounds with compounds having one (meth)acrylate group and one hydroxyl group in the molecule, and reaction products obtained by reacting compounds having (meth)acrylate group and hydroxyl group in the molecule with diisocyanate compounds obtained by reacting diol compounds and diisocyanate compounds may be exemplified.

As the diisocyanate compounds, lysine diisocyanate, hexamethylene diisocyanate, trimethylhexamethylene diisocyanate, diphenylmethane diisocyanate, hydrogenated diphenylmethane diisocyanate, toluene diisocyanate, hydrogenated toluene diisocyanate and the like may be exemplified.

As the compounds having one (meth)acrylate group and one hydroxyl group in the molecule, 2-hydroxyethyl (meth)acrylate, 2-hydroxypropyl (meth)acrylate, $CH_2=CHCOO+CH_2CH_2O)_pH$ (wherein p is an integer of not less than 2),

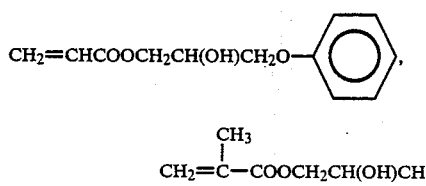

$CH_2=\overset{CH_3}{\underset{|}{C}}-COOCH_2CH(OH)CH_2OCOCH=CH_2$, trimethylolpropane di(meth)acrylate, pentaerithritol (meth)acrylate, dipentaerithritol penta(meth)acrylate, glycerin di(meth)acrylate, erithrite (meth)acrylate and the like may be exemplified.

As the diol compounds, ethylene glycol, propylene glycol, diethylene glycol, butanediol, hexanediol, neopentyl glycol, hexylene glycol, dihydroxyethyl ether of bisphenol A, dihydroxyethyl ether of hydrogenated bisphenol A, cyclohexane dimethanol, dihydroxyethyl ether of bisphenol A tetrabromide, and diol-terminated polyester compounds may be exemplified.

As the photopolymerization initiator used as the fourth component (D) in the present invention, there can be mentioned benzoin, benzoin alkyl ethers, anthraquinone derivatives, benzanthrone derivatives, 2,2-dimethoxy-2-phenylacetone, 1-hydroxycyclohexyl phenyl ketone, 2-methyl[4-(methylthio)phenyl]-2-morpholino-1-propanone, benzyl derivatives, benzophenone derivatives, 4,4'-bis-dimethylaminobenzophenone, xanthone derivatives, thioxanethone derivatives, biimidazoles, trichloromethyl-s-triazines, 3,4,3',4'-tetra(t-butylperoxycarbonyl)benzophenone, and combinations of these compounds with pigments, amine compounds such as dialkylaminobenzoic acid alkyl esters, allythiourea, N-phenylglycine, etc.

As the coating solvent (E), there can be used any of those having a proper melting point and capable of dissolving the composition, the examples thereof being methyl ethyl ketone, methyl isopropyl ketone, methyl isobutyl ketone, methyl cellosolve, ethyl cellosolve, butyl cellosolve, propylene glycol monomethyl ether, propylene glycol monoethyl ether, cyclohexanone, cellosolve acetate, carbitol, and carbitol acetate.

The high-molecular compound (A) which is an essential component of the photopolymerizable composition of the present invention, and have a weight-average molecular weight of not less than 10,000 and a polymerizable double bond in the side chain is contained in an amount of 10 to 80% by weight, preferably 10 to 50% by weight based on the total solid content excluding the coating solvent.

The polymerizable monomer (B) of the formula (I) which is another essential component of the composition of the present invention is contained in an amount of 10 to 70% by weight, preferably 15 to 50% by weight based on the total solid content.

The compound (C) is used in an amount of not more than 40% by weight, preferably 5 to 25% by weight based on the total solid content.

The photopolymerization initiator (D) is used in an amount of 0.05 to 10% by weight, preferably 0.3 to 6% by weight based on the total solid content.

The composition of the present invention may further contain an ordinary (meth)acrylate compound such as epoxy (meth)acrylate compounds, ester (meth)acrylate compounds and the like.

It is also possible to add the inorganic fine particles of not more than 10 μm in average diameter. For example, talc, calcium carbonate, silica, barium sulfate, clay, kaolin and the like can be used as such particles. The amount of such inorganic fine particles added is in the range of 10 to 50% by weight based on the total solid content.

Other additives such as heat polymerization inhibitor, colorant, plasticizer, print-out material, flame retardant, etc., may be blended as desired.

Various coating methods such as roll coating, curtain coating, screen printing, etc., can be employed for coating the composition of the present invention on a base plate. In the case of curtain coating, it is recommended to adjust the viscosity of the composition just before coating to 100 to 1,500 cps, preferably 150 to 500 cps. After the composition has been duly coated on the whole surface of a printed circuit board and the like, the solvent is removed and then the area where solder is not to be deposited is masked, followed by image exposure and development. For the development, a 1,1,1-trichloroethane solution or a weakly alkaline solution is preferably used as developer.

The composition of the present invention exhibits very good developability especially when these developers are used.

Other applications of the composition of the present invention include permanent protective coat of electronic parts and conductors, insulating protective film for integrated circuits, other permanent protective coats and precision image resist. It can be also applied to various types of resists and printing plates.

The photopolymerizable composition of the present invention has excellent resolving performance, high sensitivity, high solvent resistance and good adhesiveness to solder. It is also suited for forming a coating film which can serve as a protective mask, such as a solder resist for printed circuit boards.

The present invention will be described more particularly below by showing the examples thereof as well as comparative examples, but the invention is not limited in its scope by these examples but can be otherwise embodied without departing from the scope and spirit of the invention.

EXAMPLE 1

The compounds shown in Table 1 of the parts by weight also shown in the Table 1, and 1 part by weight of benzophenone, 0.4 parts by weight of Michler's ketone and 0.2 parts by weight of phthalocyanine green were dissolved or dispersed in 100 parts by weight of methyl cellosolve to form a photosensitive solution (400 cps in viscosity), and this solution was coated on a printed circuit board by using a curtain coater and dried to obtain a 70 μm thick coating film. The viscosity was measured by an E type viscometer at a rotor speed of 20 r.p.m. in a state where the photo-sensitive solution was moving to an extent that the thixotropy of the solution wouldn't substantially take place. Then the coating film was exposed through an image masking film by a 2 KW ultra-high pressure mercury lamp from a distance of 60 cm, and the degree of adhesion of the masking film was evaluated.

Then the coating film was subjected to spray development with a 1,1,1-trichloroethane developing-solution for 2 minutes to obtain a resist image. After evaluating the developability and sensitivity, the film was exposed by using a high-pressure mercury lamp of 80 W/cm in light intensity from a distance of 20 cm at a conveyor speed of 1 m/min and then subjected to a heat treatment at 135° C. for 20 minutes to prepare a sample for evaluation. The results are shown in Table 1.

The evaluation methods for the respective items of evaluation are explained below.

Tackiness of the coating film

1 ... No tackiness. Positioning of the masking film could be done without a hitch, and there took place no adhesion of the film after exposure.
2 ... Slight tackiness was observed, but it offered no problem practically.
3-4 ... The coating film had tackiness. It caused some difficulties in positioning the masking film. There was observed adhesion of the masking film after exposure.
5 ... The coating film had a fairly high degree of tackiness. It was hard to peel off the masking film after exposure.

Developability

This was evaluated by visually observing the remnant of the resist at the non-exposed portion after development.

| | |
|---|---|
| 1~ | No resist remained. |
| 3~ | Resist remained slightly. (Unacceptable for practical use.) |
| 5 | It was impossible to carry out development. |

Sensitivity

The number of solid steps was recorded by using Kodak 21-Step Wedge.

Solvent resistance

Each sample was immersed in dichloromethane at room temperature for one hour, and the separation of the resist and the resist surface roughness were visually observed.

Adhesiveness

The resist provided on a solder through-holed base plate was immersed in solder of 265° C. for 5 seconds, and then the resist on the solder circuit was cut into 100 equal portions and subjected to a cellophane tape peel-test, observing whether the resist was peeled off or not.

EXAMPLES 2-9 AND COMPARATIVE EXAMPLES 1-8

The samples for evaluation were prepared in the same way as Example 1 except that the compounds shown in Tables 1 and 2 were used in the amounts (parts by weight) specified in the Tables 1 and 2, and they were evaluated as in Example 1. The results are shown in Tables 1 and 2.

TABLE 1

| No. | High-molecular compound (A) (part by weight) | Polymerizable monomer (B) (part by weight) | Compound (C) (part by weight) | Extender pigment (part by weight) | Tackiness of coating film | Developability | Sensitivity (number of steps) | Solvent resistance | Adhesiveness |
|---|---|---|---|---|---|---|---|---|---|
| Example 1 | (A)-1 25 | (B)-1 25 | (C)-1 10 | Talc 20 | 2 | 1 | 6 | No problem | 100/100 |
| 2 | (A)-2 25 | (B)-1 25 | (C)-1 10 | Talc 20 | 2 | 1 | 7 | No problem | 100/100 |
| 3 | (A)-3 45 | (B)-1 10 | (C)-1 5 | Talc 20 | 2 | 1 | 7 | No problem | 100/100 |
| 4 | (A)-1 25 | (B)-2 25 | (C)-1 10 | Talc 20 | 2 | 1 | 6 | No problem | 100/100 |
| 5 | (A)-1 25 | (B)-1 25 | (C)-2 10 | Talc 20 | 2 | 1 | 6 | No problem | 100/100 |
| 6 | (A)-1 25 | (B)-1 25 | (C)-3 10 | Talc 20 | 1 | 1 | 5 | No problem | 100/100 |
| 7 | (A)-1 25 | (B)-1 25 | (C)-4 10 | Talc 20 | 1 | 1 | 5 | No problem | 100/100 |

TABLE 1-continued

| No. | High-molecular compound (A) (part by weight) | Polymerizable monomer (B) (part by weight) | Compound (C) (part by weight) | Extender pigment (part by weight) | Tackiness of coating film | Develop-ability | Sensitivity (number of steps) | Solvent resistance | Adhesiveness |
|---|---|---|---|---|---|---|---|---|---|
| 8 | (A)-1 25 | (B)-1 29 | (C)-4 20 | Talc 6 | 1 | 1 | 5 | No problem | 100/100 |
| 9 | (A)-1 25 | (B)-1 25 | (C)-5 10 | Talc 20 | 1 | 1 | 5 | No problem | 100/100 |

TABLE 2

| No. | Composition (part by weight) | | | Extender pigment | Tackiness of coating film | Develop-ability | Sensitivity (number of steps) | Solvent resistance | Adhesiveness |
|---|---|---|---|---|---|---|---|---|---|
| Comp. Example 1 | (D)-1 25 | (B)-1 25 | (C)-1 10 | Talc 20 | 2 | 1 | 4 | Surface was roughened | 80/100 |
| 2 | (D)-2 25 | (B)-1 25 | (C)-1 10 | Talc 20 | 5 | 1 | 6 | No problem | 100/100 |
| 3 | (D)-3 25 | (B)-1 25 | (C)-1 10 | Talc 20 | 4 | 3 | 6 | No problem | 80/100 |
| 4 | (D)-3 40 | (B)-1 10 | (C)-1 10 | Talc 20 | 2 | 5 | 5 | No problem | 70/100 |
| 5 | (D)-4 25 | (B)-1 25 | (C)-1 10 | Talc 20 | 5 | 3 | 6 | No problem | 100/100 |
| 6 | (A)-1 25 | (E)-1 35 | | Talc 20 | 5 | 1 | 6 | Fine line portion peeled | 100/100 |
| 7 | (A)-1 40 | (E)-1 20 | | Talc 20 | 2 | 1 | 4 | Whole surface peeled | 100/100 |
| 8 | (A)-1 25 | (C)-3 35 | | Talc 20 | 3 | 1 | 4 | Whole surface peeled | 100/100 |

The compounds shown by symbols in the tables are as follows:

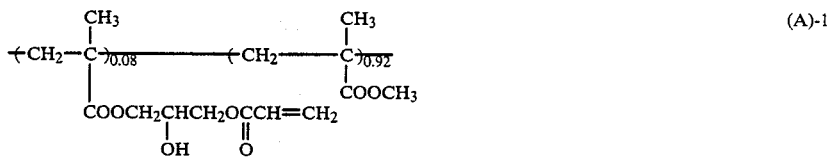

(A)-1

Weight-average molecular weight (hereinafter referred to as Mw) = $17 \times 10^4$

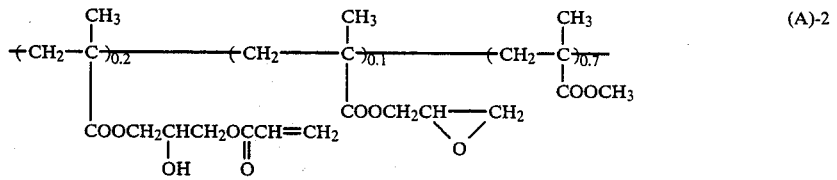

(A)-2

Mw = $10 \times 10^4$

Diallyl phthalate polymer "Daiso Isodap" (made by Osaka Soda Co., Ltd.) Mw = $5 \times 10^4$     (A)-3

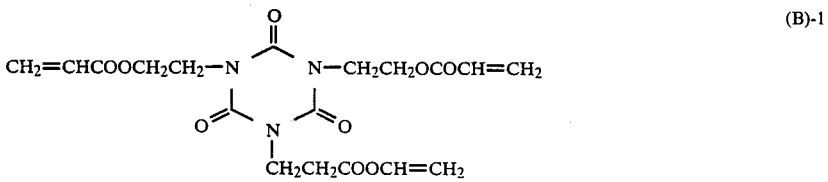

(B)-1

-continued

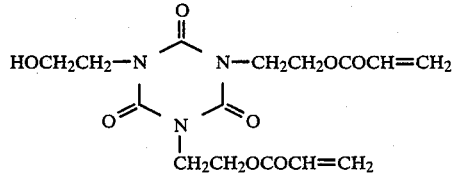 (B)-2

N-vinyl-2-pyrrolidone (C)-1
$CH_2=CHCOO(CH_2CH_2O)_{14}COCH=CH_2$ (C)-2
A—IP—B—IP—A (C)-3

(wherein A is 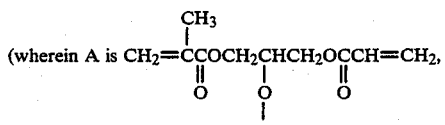,

IP is , and

B is 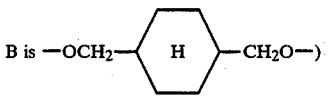 )

U-108A (urethane acrylate produced by Shin Nakamura Kagaku K.K.) (C)-4
A—IP—A (C)-5
(wherein A and IP represent the same as defined above)

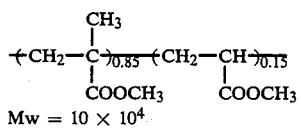 (D)-1
$Mw = 10 \times 10^4$

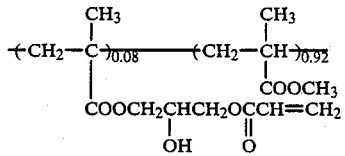 (D)-2
$Mw = 5 \times 10^3$

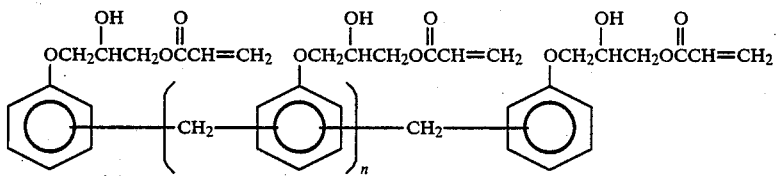 (D)-3
$Mw = 3.5 \times 10^3$

SP-1507 (bisphenol A type epoxy acrylate produced by Showa Kobunshi K.K.) (D)-4
Trimethylolpropane triacrylate (E)-1

What is claimed is:
1. A photopolymerizable composition, comprising:
(a) about 10–80% by weight of a diallyl phthalate polymer having a weight-average molecular weight not less than 10,000 or a (meth)acrylic polymer having a weight-average molecular weight of not less than 10,000 and having repeating units therein of the formula:

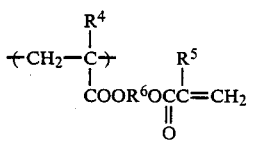

wherein $R^4$ and $R^5$ are the same or different and represent a hydrogen atom or a methyl group, and $R^6$ represents a group of the formula:

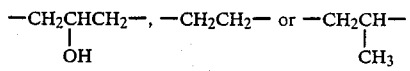

(b) a compound having the formula:

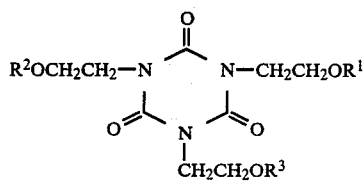

wherein $R^1$, $R^2$ and $R^3$ represent a hydrogen atom, or a group of the formula:

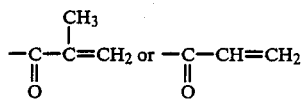

with the proviso that not more than one of $R^1$, $R^2$ or $R^3$ is a hydrogen atom at the same time; and (c) an effective amount of a photoinitiator.

2. The photopolymerizable composition according to claim 1, further containing at least one of N-vinyl-2-pyrrolidone, urethane(meth)acrylate compounds and monomers having the structural units represented by the following formula (II), and a coating solvent:

3. The composition according to claim 1, having a viscosity in the range of about 100–1,500 cps.

4. The composition according to claim 3, wherein the weight-average molecular weight of the high-molecular compound having a polymerizable double bond in the side chain is in the range of 30,000 to 300,000.

5. The composition according to claim 3, further containing the inorganic fine particles having an average diameter of not more than 10 μm.

6. The composition according to claim 2, wherein based on the total solid content, the content of at least one of N-vinyl-2-pyrrolidone, urethane(meth)acrylate compounds and monomers having the structural units represented by the formula (II) is not more than 40% by weight.

7. The composition according to claim 5, wherein based on the total solid content, the content of inorganic fine particles is 10 to 50% by weight.

* * * * *